(12) United States Patent
Troost et al.

(10) Patent No.: US 8,264,667 B2
(45) Date of Patent: Sep. 11, 2012

(54) LITHOGRAPHIC APPARATUS AND DEVICE MANUFACTURING METHOD USING INTERFEROMETRIC AND OTHER EXPOSURE

(75) Inventors: Kars Zeger Troost, Waalre (NL); Johannes Jacobus Matheus Baselmans, Oirschot (NL); James Sherwood Greeneich, Prescott, AZ (US)

(73) Assignee: ASML Netherlands B.V., Veldhoven (NL)

( * ) Notice: Subject to any disclaimer, the term of this patent is extended or adjusted under 35 U.S.C. 154(b) by 353 days.

(21) Appl. No.: 11/417,210

(22) Filed: May 4, 2006

(65) Prior Publication Data

US 2007/0258078 A1 Nov. 8, 2007

(51) Int. Cl.
G03B 27/54 (2006.01)
G03B 27/42 (2006.01)
G02B 27/00 (2006.01)

(52) U.S. Cl. .............................. 355/67; 355/53; 359/577

(58) Field of Classification Search .................... 355/67, 355/70, 72, 53; 359/577
See application file for complete search history.

(56) References Cited

U.S. PATENT DOCUMENTS

| | | | |
|---|---|---|---|
| 4,560,249 A | 12/1985 | Nishiwaki et al. | |
| 4,596,467 A | 6/1986 | Bartelt | |
| 4,792,197 A | 12/1988 | Inoue et al. | |
| 4,806,454 A | 2/1989 | Yoshida et al. | |
| 4,822,975 A * | 4/1989 | Torigoe | 219/121.85 |
| 5,142,385 A | 8/1992 | Anderson et al. | |
| 5,229,872 A | 7/1993 | Mumola | |
| 5,296,891 A | 3/1994 | Vogt et al. | |
| 5,414,835 A | 5/1995 | Iijima | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,640,239 A | 6/1997 | Takamiya et al. | |
| 5,677,703 A | 10/1997 | Bhuva et al. | |
| 5,705,321 A | 1/1998 | Brueck et al. | |
| 5,759,744 A | 6/1998 | Brueck et al. | |
| 5,771,098 A | 6/1998 | Ghosh et al. | |
| 5,808,797 A | 9/1998 | Bloom et al. | |
| RE36,113 E | 2/1999 | Brueck et al. | |
| 5,982,553 A | 11/1999 | Bloom et al. | |
| 6,013,396 A | 1/2000 | Capodieci | |
| 6,133,986 A | 10/2000 | Johnson | |

(Continued)

FOREIGN PATENT DOCUMENTS

EP 0243520 B1 11/1991

(Continued)

OTHER PUBLICATIONS

Wolf et al., Silicon Processing for the VSLI Era vol. 1, Lattice Press, 2000, pp. 593.*

(Continued)

*Primary Examiner* — Hung Henry Nguyen
*Assistant Examiner* — Steven H Whitesell Gordon
(74) *Attorney, Agent, or Firm* — Sterne, Kessler, Goldstein & Fox P.L.L.C.

(57) ABSTRACT

A lithographic apparatus including an exposure unit that exposes parallel lines on a target area of a substrate by projecting two beams of radiation onto the substrate. The two beams of radiation are projected such that they interfere with each other to form the parallel lines. An actuator continuously moves the substrate relative to the exposure unit, while the exposure unit exposes the parallel lines on the target areas on the substrate.

34 Claims, 12 Drawing Sheets

U.S. PATENT DOCUMENTS

| | | |
|---|---|---|
| 6,177,980 B1 | 1/2001 | Johnson |
| 6,178,000 B1 | 1/2001 | Hoffnagle |
| 6,185,019 B1 | 2/2001 | Hobbs et al. |
| 6,233,044 B1 | 5/2001 | Brueck et al. |
| 6,285,488 B1 | 9/2001 | Sandstrom |
| 6,304,318 B1 | 10/2001 | Matsumoto |
| 6,317,195 B1 * | 11/2001 | Taniguchi ................ 355/53 |
| 6,320,648 B1 | 11/2001 | Brueck et al. |
| 6,556,280 B1 | 4/2003 | Kelsey et al. |
| 6,641,268 B2 | 11/2003 | Bloomstein et al. |
| 6,687,041 B1 | 2/2004 | Sandstrom |
| 6,717,736 B1 | 4/2004 | Hill |
| 6,747,783 B1 | 6/2004 | Sandstrom |
| 6,795,169 B2 | 9/2004 | Tanaka et al. |
| 6,806,897 B2 | 10/2004 | Kataoka et al. |
| 6,811,953 B2 | 11/2004 | Hatada et al. |
| 6,813,058 B1 | 11/2004 | Sandstrom |
| 6,830,850 B1 | 12/2004 | Krivokapic et al. |
| 6,882,477 B1 | 4/2005 | Schattenburg et al. |
| 7,187,399 B2 | 3/2007 | Noguchi et al. |
| 7,440,078 B2 | 10/2008 | Bleeker et al. |
| 2001/0021487 A1 | 9/2001 | Williams et al. |
| 2001/0035991 A1 | 11/2001 | Hobbs et al. |
| 2002/0030802 A1 | 3/2002 | Sugita et al. |
| 2002/0031725 A1 | 3/2002 | Sugita et al. |
| 2002/0134985 A1 | 9/2002 | Chen et al. |
| 2002/0149751 A1 | 10/2002 | Bloomstein et al. |
| 2002/0149757 A1 | 10/2002 | Kelsey et al. |
| 2002/0149849 A1 | 10/2002 | Kelsey et al. |
| 2003/0098979 A1 | 5/2003 | Dress et al. |
| 2003/0147082 A1 | 8/2003 | Goldstein |
| 2004/0041104 A1 | 3/2004 | Liebregts et al. |
| 2004/0042724 A1 | 3/2004 | Gombert et al. |
| 2004/0110092 A1 | 6/2004 | Lin |
| 2004/0130561 A1 | 7/2004 | Jain |
| 2005/0007572 A1 | 1/2005 | George et al. |
| 2005/0012933 A1 | 1/2005 | Matthews |
| 2005/0057735 A1 | 3/2005 | Smith |
| 2005/0064297 A1 | 3/2005 | Wago |
| 2005/0068510 A1 * | 3/2005 | Bleeker et al. ............. 355/67 |
| 2005/0073671 A1 | 4/2005 | Borodovsky |
| 2005/0074698 A1 | 4/2005 | Borodovsky |
| 2005/0083497 A1 * | 4/2005 | Borodovsky ............... 355/53 |
| 2005/0088633 A1 | 4/2005 | Borodovsky |
| 2005/0094152 A1 | 5/2005 | Allen |
| 2005/0105100 A1 | 5/2005 | Swindal |
| 2005/0168717 A1 | 8/2005 | Hinsberg, III et al. |
| 2006/0127024 A1 * | 6/2006 | Smith et al. ............... 385/132 |
| 2006/0170896 A1 | 8/2006 | Markoya et al. |
| 2007/0153249 A1 | 7/2007 | Troost et al. |
| 2007/0153250 A1 | 7/2007 | Sewell et al. |

FOREIGN PATENT DOCUMENTS

| | | |
|---|---|---|
| EP | 915384 A2 * | 5/1999 |
| JP | 61-190368 A | 8/1986 |
| JP | 3-263313 A | 11/1991 |
| JP | 4-163461 A | 6/1992 |
| JP | 5-072408 A | 3/1993 |
| JP | 5-217856 A | 8/1993 |
| JP | 6-053122 A | 2/1994 |
| JP | 6-053122 U | 7/1994 |
| JP | 10-270330 A | 10/1998 |
| JP | 2000-021716 A | 1/2000 |
| JP | 2000-021720 A | 1/2000 |
| JP | 2000-223400 A | 8/2000 |
| JP | 2001-007020 A | 1/2001 |
| JP | 2001-223149 A | 8/2001 |
| JP | 2002-162750 A | 6/2002 |
| JP | 2004-014866 A | 1/2004 |
| JP | 2004-014867 A | 1/2004 |
| JP | 2004-317922 A | 11/2004 |
| JP | 2005-062847 A | 3/2005 |
| JP | 2005-099537 A | 4/2005 |
| JP | 2005-134873 A | 5/2005 |
| KR | 9401227 B1 | 2/1994 |
| WO | WO 98/18049 A1 | 4/1998 |
| WO | WO 98/33096 A1 | 7/1998 |
| WO | WO 98/38597 A2 | 9/1998 |
| WO | WO 98/38597 A3 | 9/1998 |
| WO | WO 2004/003611 A1 | 1/2004 |
| WO | WO 2004/088363 A1 | 10/2004 |

OTHER PUBLICATIONS

"Interference Lithography", MTL Annual Report 2003, Submicron and Nanometer Structures, pp. 186 to 188.

Notification of Reasons for Refusal mailed Jun. 29, 2010 for Japanese Patent Application No. 2007-120524, 2 pgs.

English Abstract for Japanese Publication No. JP 2002-506231 T published Feb. 26, 2002, 1 pg.

* cited by examiner

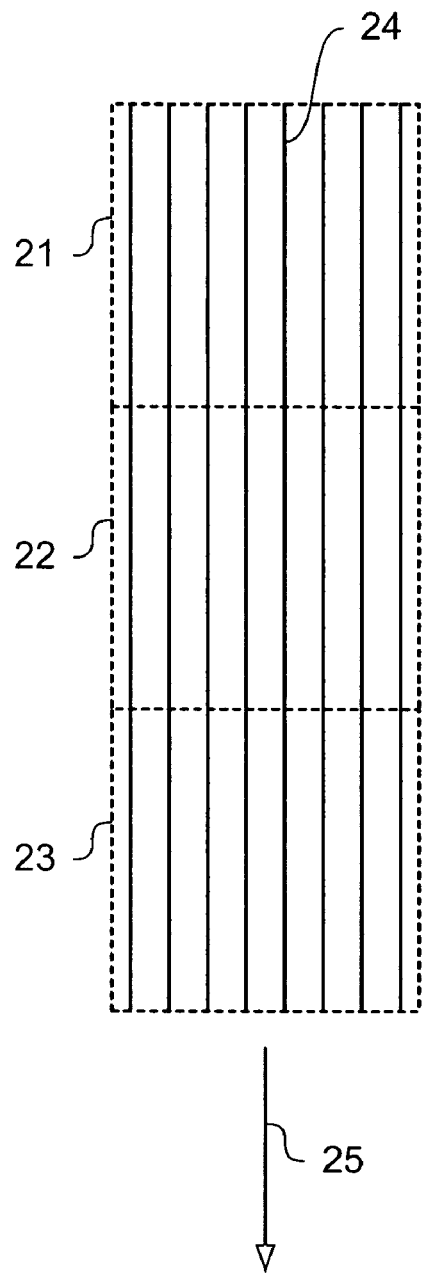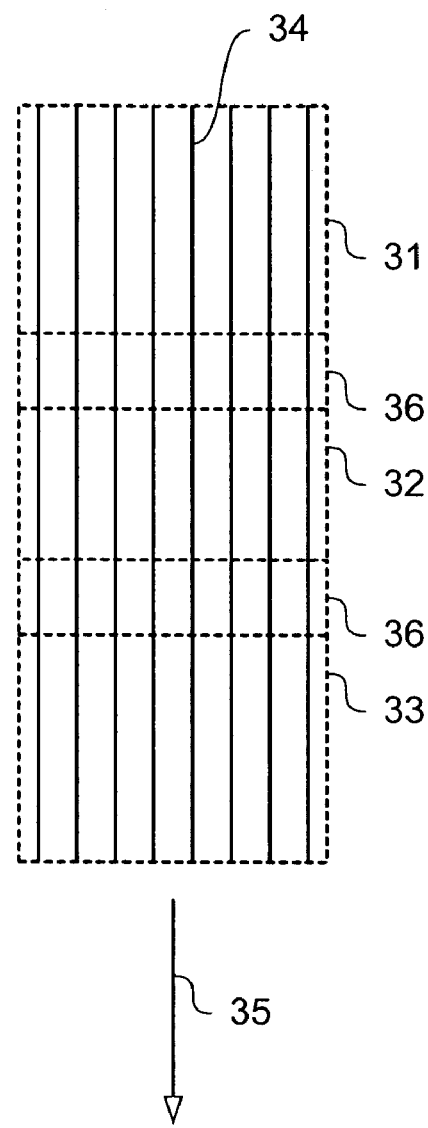

LITHOGRAPHIC APPARATUS AND DEVICE MANUFACTURING METHOD USING INTERFEROMETRIC AND OTHER EXPOSURE

BACKGROUND

1. Field of the Present Invention

The present invention relates to a lithographic apparatus and a method for manufacturing a device.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., resist) provided on the substrate.

Instead of a circuit pattern, the patterning device can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

In order to generate devices with ever smaller features, with ever more customization within devices, and in ever more cost-effective ways, there is a continuing drive to improve lithographic methods. However, these three goals often interfere. For example, a new technique can permit the provision of smaller features, but increases the processing time necessary to form the device, thereby increasing the cost of the device. Similarly, a provision of processes that allow greater flexibility in forming the devices can require a compromise in the size of features that can be formed and/or increase the cost of forming a device.

In order to provide an improved process, it has been proposed to provide a lithographic system in which the pattern formed on a substrate is made up of an exposure performed by projecting beams of radiation onto a substrate. The beams interfere in order to provide a repeating, but high resolution, pattern. Exposure of a lower resolution pattern, for example using a patterning device as discussed above, is used in order to "trim" the high resolution repeating pattern to form the desired completed pattern.

Therefore, what is needed is a system and method for controlling the exposure of a substrate by interfering beams of radiation that provide a high resolution repeating pattern.

SUMMARY

In one embodiment of the present invention, there is provided a lithography apparatus for exposing a pattern on a substrate comprising a substrate support, an exposure unit, and an actuator. The substrate support is configured to support the substrate. The exposure unit projects two beams of radiation onto the substrate, such that the two beams of radiation interfere to expose a plurality of parallel lines on an area of the substrate. The actuator moves continuously the substrate support relative to the exposure unit, while the exposure unit exposes lines on a plurality of areas on the substrate.

In another embodiment of the present invention, there is provided a device manufacturing method comprising to following steps. Using an exposure unit to project two beams of radiation onto a substrate supported on a substrate support such that the two beams of radiation interfere to expose a plurality of parallel lines on an area of the substrate. Continuously moving the substrate support relative to the exposure unit while lines are exposed on a plurality of areas on the substrate by the exposure unit.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the present invention and to enable a person skilled in the pertinent art to make and use the present invention.

FIGS. 6a and 6b depict alternative arrangements of areas on a substrate exposed with lines in a single movement of the substrate support relative to the exposure unit, according to one embodiment of the present invention.

Figure 1:
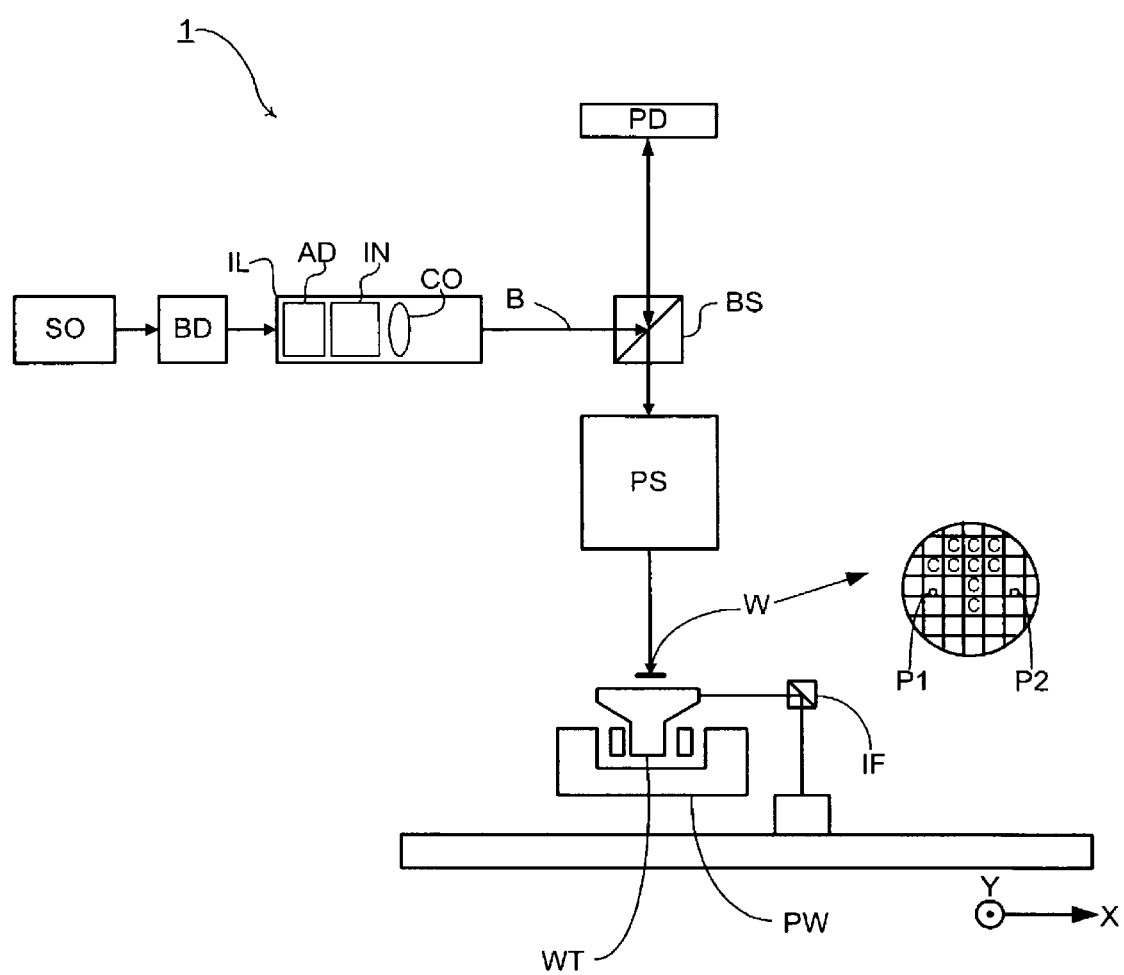
FIGS. 1 and 2 depict lithographic apparatus, according to various embodiments of the present invention.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

FIG. 1 schematically depicts the lithographic apparatus of one embodiment of the present invention. The apparatus comprises an illumination system IL, a patterning device PD, a substrate table WT, and a projection system PS. The illumination system (illuminator) IL is configured to condition a radiation beam B (e.g., UV radiation).

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1,000, at least 10,000, at least 100,000, at least 1,000,000, or at least 10,000,000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another Example PD is a Programmable LCD Array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 1, the substrate W has a substantially circular shape, optionally with a notch and/or a flattened edge along part of its perimeter. In an example, the substrate has a polygonal shape, e.g., a rectangular shape.

Examples where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In one embodiment, the substrate has a diameter of at most 500 mm, at most 400 mm, at most 350 mm, at most 300 mm, at most 250 mm, at most 200 mm, at most 150 mm, at most 100 mm, or at most 75 mm.

Examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. The wafer can be: a III/V compound semiconductor wafer, a silicon wafer, a ceramic substrate, a glass substrate, or a plastic substrate. The substrate can be transparent (for the naked human eye), colored, or absent a color.

The thickness of the substrate can vary and, to an extent, can depend, e.g., on the substrate material and/or the substrate dimensions. In one example, the thickness is at least 50 cm, e.g., at least 100 µm, at least 200 µm, at least 300 µm, at least 400 µm, at least 500 µm, or at least 600 µm. The thickness of the substrate can be at most 5000 µm, e.g., at most 3500 µm, at most 2500 µm, at most 1750 µm, at most 1250 µm, at most 1000 µm, at most 800 µm, at most 600 µm, at most 500 µm, at most 400 µm, or at most 300 µm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate. In one example, the array of focusing elements (e.g., MLA) comprises at least 10 focus elements, e.g., at least 100 focus elements, at least 1,000 focus elements, at least 10,000 focus elements, at least 100,000 focus elements, or at least 1,000,000 focus elements. In one example, the number of individually controllable elements in the patterning device is equal to or greater than the number of focusing elements in the array of focusing elements. In one example, one or more (e.g., 1,000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of one or more actuators) at least in the direction to and away from the substrate. Being able to move the MLA to and away from the substrate allows, e.g., for focus adjustment without having to move the substrate.

Figure 2:
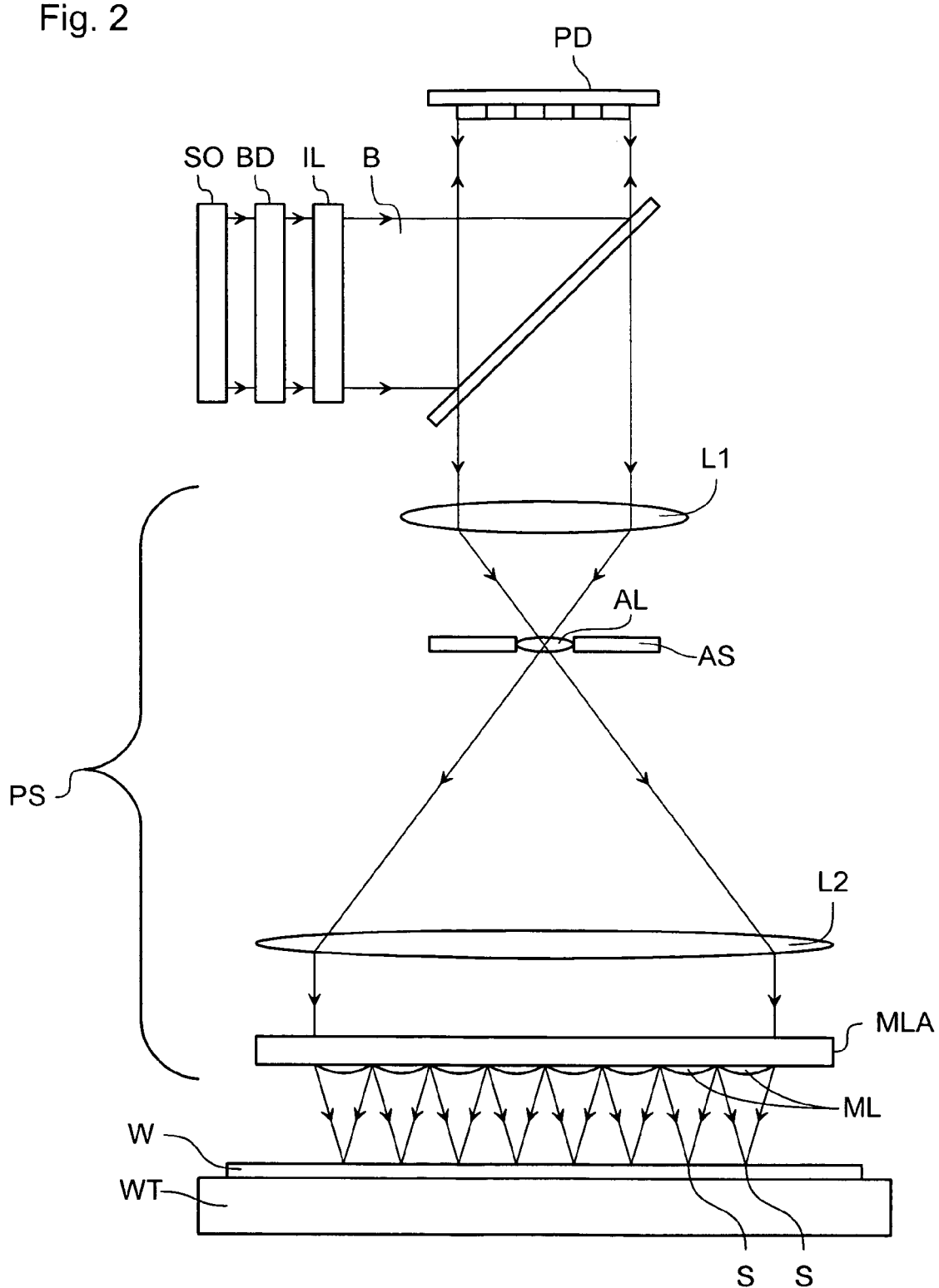

As herein depicted in FIGS. 1 and 2, the apparatus is of a reflective type (e.g., employing a reflective array of individually controllable elements). Alternatively, the apparatus can be of a transmission type (e.g., employing a transmission array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 1, the illuminator IL receives a radiation beam from a radiation source SO. In one example, the radiation source provides radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (course positioning) and a short-stroke module (fine positioning), which are not explicitly depicted in FIG. 1. In another example, a short stroke stage may not be present. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 1, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 1 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 1 may not be required if a transmission patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. Continuous scan mode is essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 2, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (e.g., just a maximum value and a minimum value). In one embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In one embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (e.g., a required radiation dose profile across the substrate); converting a required radiation dose map into required radiation intensity values for each individually controllable element; and converting the required radiation intensity values for each individually controllable element into corresponding control signals.

FIG. 2 depicts an arrangement of the apparatus according to the present invention that can be used, e.g., in the manufacture of flat panel displays. Components corresponding to those shown in FIG. 1 are depicted with the same reference numerals. Also, the above descriptions of the various embodiments, e.g., the various configurations of the substrate, the contrast device, the MLA, the beam of radiation, etc., remain applicable.

As shown in FIG. 2, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

Figure 3:
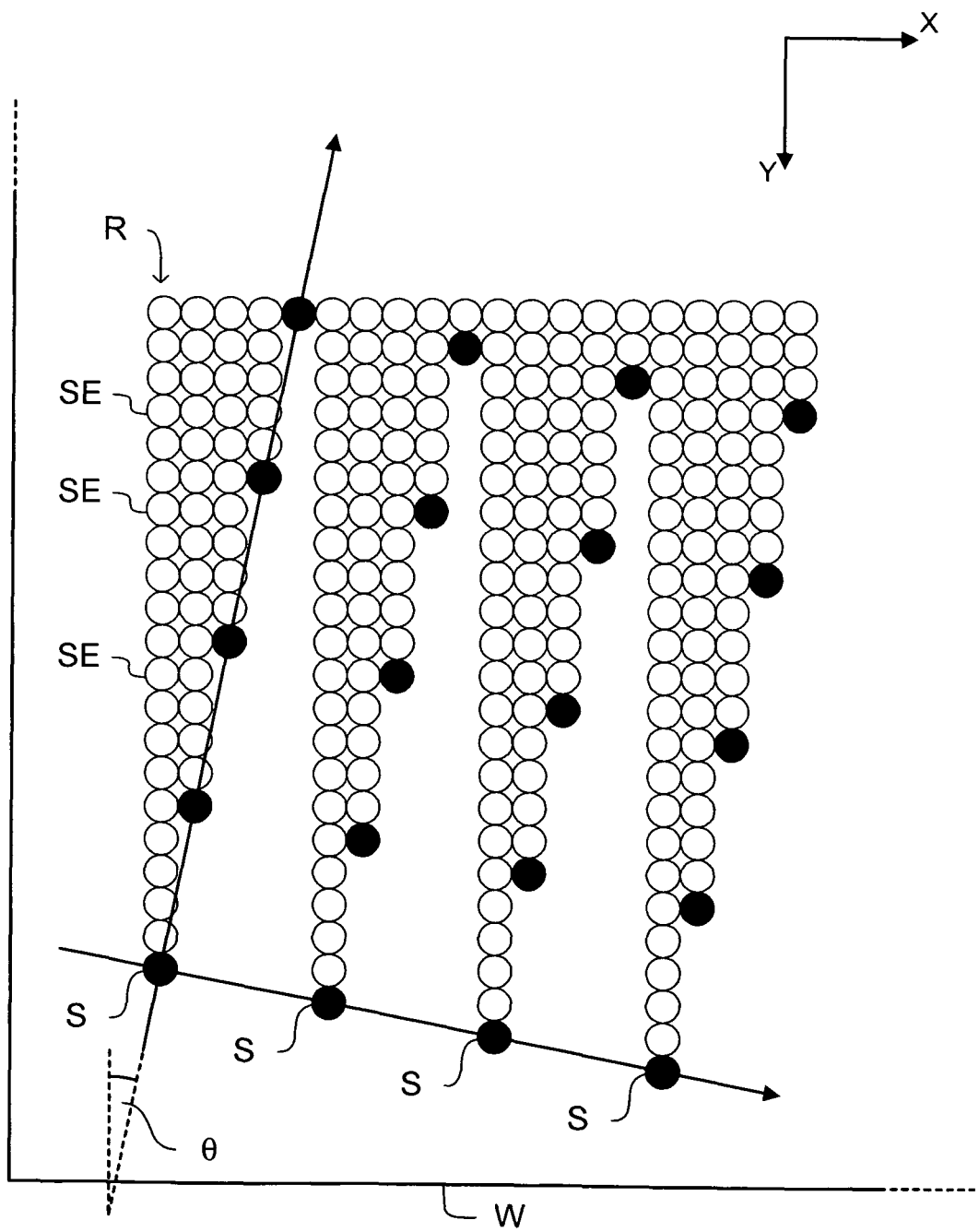
FIG. 3 depicts a mode of transferring a pattern to a substrate according to one embodiment of the present invention as shown in FIG. 2.

FIG. 3 illustrates schematically how a pattern on a substrate W is generated using the system of FIG. 2, according to one embodiment of the present invention. The filled in circles represent the array of spots S projected onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. As shown, each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

It can be seen that the array of radiation spots S is arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

Figure 4:
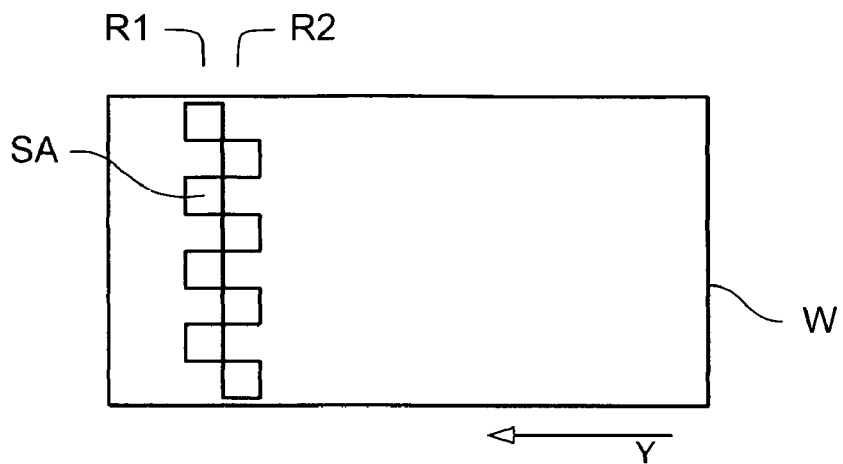
FIG. 4 depicts an arrangement of optical engines, according to one embodiment of the present invention.

FIG. 4 shows schematically how an entire flat panel display substrate W can be exposed in a single scan using a plurality of optical engines, according to one embodiment of the present invention. In the example shown eight arrays SA of radiation spots S are produced by eight optical engines (not shown), arranged in two rows R1, R2 in a "chess board" configuration, such that the edge of one array of radiation spots (e.g., spots S in FIG. 3) slightly overlaps (in the scanning direction Y) with the edge of the adjacent array of radiation spots. In one example, the optical engines are arranged in at least 3 rows, for instance 4 rows or 5 rows. In this way, a band of radiation extends across the width of the substrate W, allowing exposure of the entire substrate to be performed in a single scan. It will be appreciated that any suitable number of optical engines can be used. In one example, the number of optical engines is at least 1, e.g., at least 2, at least 4, at least 8, at least 10, at least 12, at least 14, or at least 17. In one example, the number of optical engines is less than 40, e.g., less than 30 or less than 20.

Each optical engine can comprise a separate illumination system IL, patterning device PD and projection system PS as described above. It is to be appreciated, however, that two or more optical engines can share at least a part of one or more of the illumination system, patterning device and projection system.

Figure 5A:
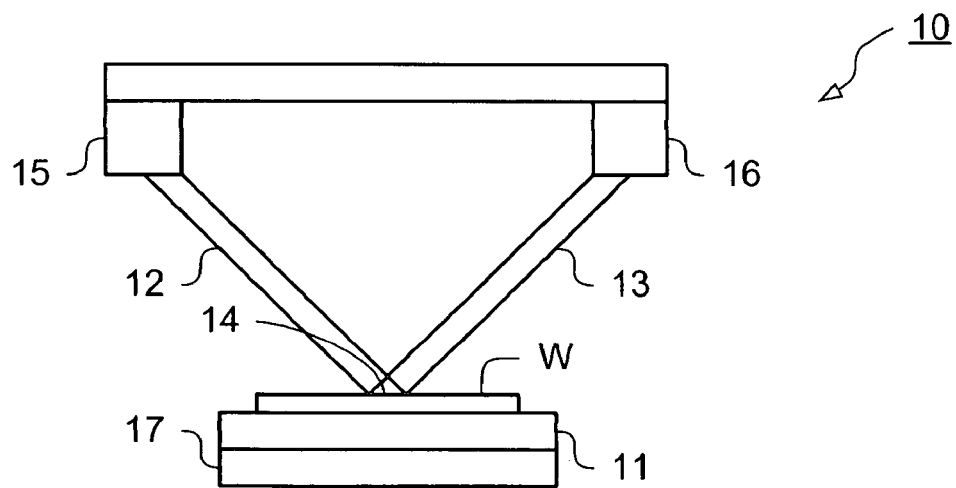
FIGS. 5a and 5b depict in side view and plan view, respectively, an arrangement of an exposure unit used in a lithographic apparatus, according to one embodiment of the present invention.
Figure 5B:
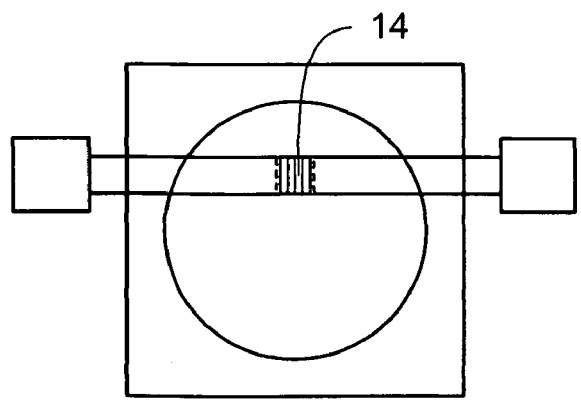

FIGS. 5a and 5b schematically depict in cross-section and plan view, respectively, an exposure unit 10 that can be used in according with one embodiment of the present invention. As depicted, the substrate W is supported on a substrate support 11. First and second beams of radiation 12,13 are projected onto the substrate W, such that they interfere in an area 14 on the substrate W at which the two beams of radiation 12,13 are incident.

Exemplary systems describing interferometric lithography can be found in co-owned and co-pending U.S. application Ser. Nos. 11/341,381, filed Jan. 30, 2006, 11/320,473, filed Dec. 29, 2005, 11/311,643, filed Dec. 20, 2005, and 11/311,640, filed Dec. 20, 2005, which are all incorporated by reference herein in their entireties.

The beams of radiation 12,13 are projected on the substrate W using respective conditioning units 15,16. The conditioning units 15,16 condition the beams of radiation 12,13 in order to provide the required intensity profile, for example. The beams of radiation 12,13 can be generated in sources within the exposure unit or in sources located external to the exposure unit 10, or even external to the lithographic apparatus, and supplied to the conditioning units 15,16 by, for example, via a fiber optic connection. It should also be appreciated that both beams of radiation 12,13 can be derived from a single radiation source (either internal or external to the exposure unit 10). In such a case, the beam of radiation generated by the single radiation source is divided by a radiation beam divider and provided to the radiation beam conditioning units 15,16.

As depicted in FIG. 5b, the interference of the first and second beams of radiation 12,13 results in a series of lines being exposed on the substrate W in the area 14 in which the beams of radiation 12,13 are incident. Although not depicted in FIGS. 5a and 5b, it should be understood that the beams of radiation can be projected through a liquid provided on the surface of the substrate, e.g., the beams are projected using an immersion lithography system. In this example, the use of an immersion liquid enables the exposure of lines with a smaller pitch. In general, the pitch of the lines will be:

$$\frac{\lambda}{2n\sin\theta}$$

where λ is the wavelength of the radiation, n is the refractive index of the medium adjacent the substrate and θ is the angle between the beams of radiation and a normal to the surface of the substrate.

As depicted in FIG. 5b, the area 14 in which the exposure unit exposes a plurality of lines is significantly smaller than the area of the substrate W. In practice, the area 14 in which the plurality of lines are exposed by the exposure unit can be an even smaller proportion of the area of the substrate W than is depicted in FIG. 5b. For example, the area in which lines are exposed by the exposure unit can be approximately 2 mm×2 mm, limited by spatial and temporal coherence of the beams and/or the use of beam shape defining elements such as (grayscale) masks, whereas the substrate W can have a diameter of approximately 300 mm. Accordingly, it may be necessary to exposure multiple areas of the substrate W using the exposure unit 10. This can be performed by moving the substrate support 11 (with the substrate W supported upon it) relative to the exposure unit 10 such that the lines can be exposed on different areas of the substrate. Accordingly, as depicted in FIG. 5a, the lithographic apparatus includes an actuator 17 configured to move the substrate support 1 relative to the exposure unit 10. It should be appreciated, however, that alternatively or additionally, an actuator could be provided to move the exposure unit 10.

The lithographic apparatus could be arranged such that the substrate support 11 is moved relative to the exposure unit 10 until a required relative position is provided. The, the relative movement is stopped and the beams of radiation 12,13 are projected onto the substrate in order to expose a plurality of lines on the desired area on the substrate. At that stage, the substrate support 11 can, again, be moved relative to the exposure unit 10 and the process repeated in order to expose the plurality of lines on a second desired area. By repeating the process a plurality of times, lines can be exposed on the substrate W in all of the areas required. Such a process can be very accurate as the position of the substrate W relative to the exposure unit 10 can be precisely determined before each exposure of a plurality of lines is performed on each area on the substrate. However, such a process would be relatively slow.

Accordingly, in one example the actuator 17 is configured such that it continuously moves the substrate support 11, and hence the substrate W, relative to the exposure unit 10 while the exposure unit exposes lines on a plurality of areas of the substrate. Accordingly, the process of exposing the lines on all the areas required on the substrate can be completed more quickly. However, in contrast to the step and expose arrangement, careful control is required of the timing of the exposures by the exposure unit 10 and/or the control of the movement of the substrate support 11 relative to the exposure unit.

EMBODIMENT 1

According to a first embodiment of the present invention, the actuator 17 is configured to move the substrate support 11 relative to the exposure unit 10 in a direction parallel to the lines exposed by the exposure unit during a sequence of exposures of the exposure unit in which lines are exposed on a plurality of areas on the substrate. Accordingly, the areas on the substrate W on which the lines are exposed during a continuous movement of the substrate support relative to the exposure unit are aligned in a direction that is parallel to the lines exposed on the substrate.

FIG. 6a depicts the arrangement of a plurality of areas 21,22,23 on a substrate in which a plurality of lines 24 have been exposed in a single movement of the substrate support relative to the exposure unit in a direction 25 that is parallel to the lines 24 exposed on the substrate. As depicted, the second area 22 is immediately adjacent the first area 21 and the third area 23 is immediately adjacent the second area 22. Accordingly, continuous lines 24 can be formed across all three areas 21,22,23.

In order to expose the lines on the plurality of areas 21,22,23 while the substrate support 11 is continuously moved relative to the exposure unit 10, the exposure unit 10 can use beams of radiation 12,13 that are pulsed in synchronism. The movement of the substrate support 11 and the pulsing of the pulsed beams of radiation 12,13 are timed such that the areas 21,22,23 exposed by successive pulses are immediately adjacent. In order to simplify the lithographic apparatus, the substrate support 11 can be moved at a constant velocity relative to the exposure unit 10 and, accordingly, the beams of radiation 12,13 can be pulsed at a constant frequency. Alternatively, the movement of the substrate table 11 relative to the exposure unit 10 can be monitored and the radiation source or sources used to provide the beams of radiation 12,13 triggered based on the measured movement of the substrate support 11 in order to provide the pulses at the required times.

FIG. 6b depicts a variation of the arrangement depicted in FIG. 6a. As before, successive areas 31,32,33 on the substrate are exposed by the exposure unit 10 to produce a plurality of lines 34, while the substrate support 11 is moved in a direction 35 that is parallel to the direction of exposure of the lines 34. However, in this arrangement, the first and second areas 31,32 are arranged to overlap in an area 36 and the second and third areas 32,33 are arranged to overlap in an area 37. In one example, when the areas overlap, even if there are small inaccuracies in the positioning of one area relative to the next, there is substantially no risk of a gap remaining between lines formed in adjacent areas.

It will be appreciated that the total dose of radiation received at each point on one of the lines exposed on the substrate will determine the precise width of the line at that point. Accordingly, it is desirable to control the dose received at each point on a line, for example to ensure that the width remains constant along the length of a line, regardless of the area in which it was formed or if it was formed in the boundary region between two areas. Accordingly, in an arrangement such as depicted in FIG. 6b, the intensity of the radiation projected on to the substrate along each line within an area can be arranged, such that the radiation intensity in a part of the area that does not overlap with an adjacent area is higher than the intensity of the radiation in a part of the area that does overlap with an adjacent area. For example, in the arrangement depicted in FIG. 6b, the intensity of the radiation projected onto the substrate to form the line in the overlap areas 36,37 can be less than the intensity in the remainder of the second area 32.

In one example, the decreased intensity in the overlap areas can be a step change, for example 50% of the intensity of the non-overlapped parts for the entire overlap portion of an area. Accordingly, the total dose of radiation received by a point on the substrate corresponding to a line within an overlap region is the same as the dose received in a non-overlap part of an area, half of the dose received from one exposure area and the remainder received from the next exposure area.

Figure 7A:
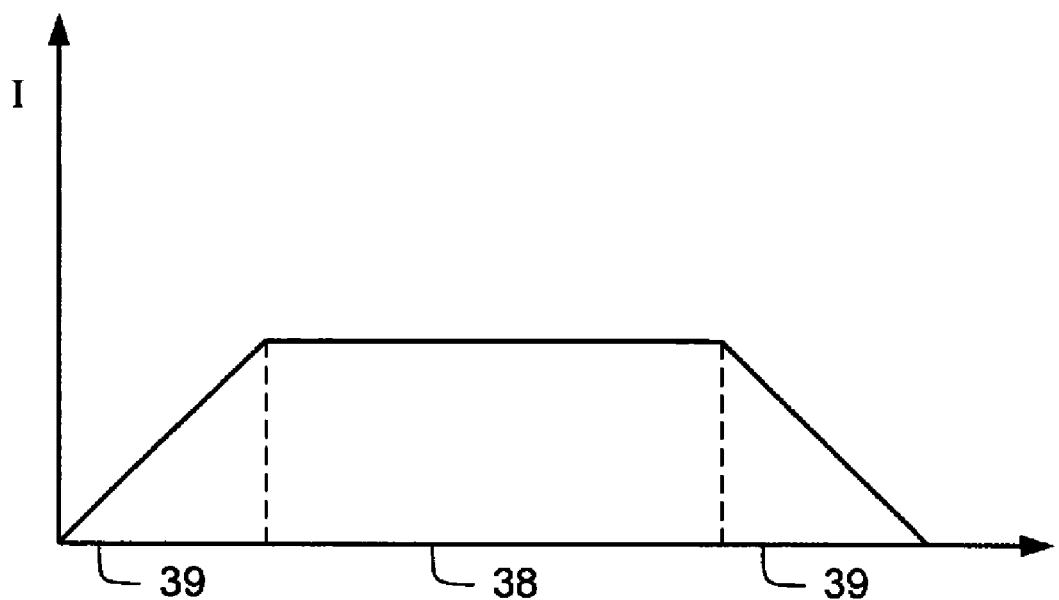
FIG. 7a depicts a distribution of radiation intensity along a line exposed on a substrate by a lithographic apparatus, according to one embodiment of the present invention.

Alternatively, however, the intensity of the radiation within a line can vary across the overlap part of the area. FIG. 7a depicts the intensity profile along a line within an area in such an arrangement. As shown, the intensity I is a maximum for a part 38 of the area corresponding to the non-overlapping part of the area and decreases linearly to zero in the parts 39 of the area corresponding to parts of the area that overlap with adjacent exposure areas.

Figure 7B:
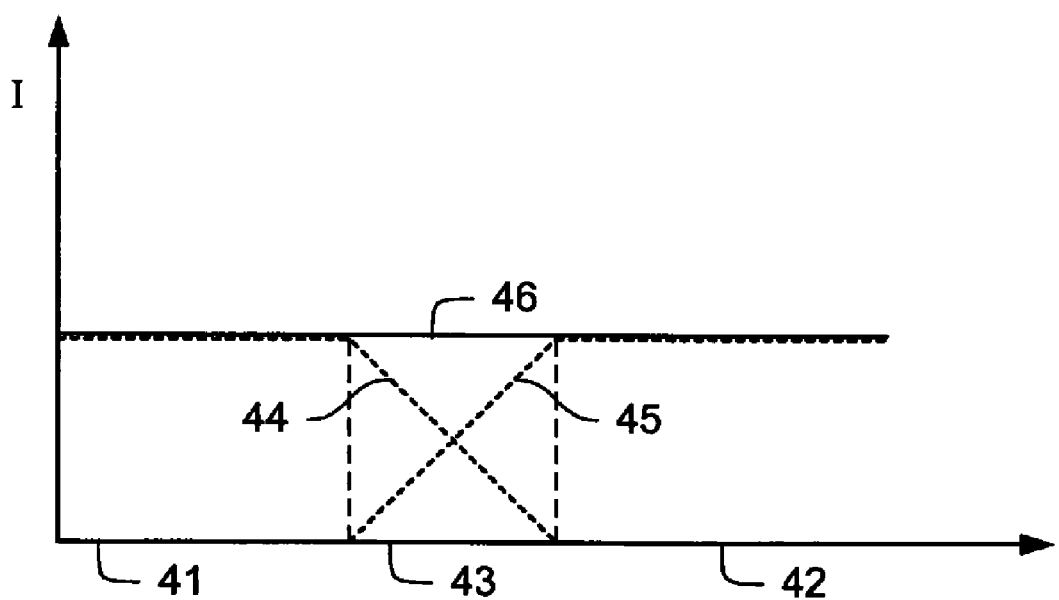
FIG. 7b depicts an intensity distribution along a line exposed on a substrate by an apparatus, according to one embodiment of the present invention at the boundary between two areas.

Alternatively or additionally, FIG. 7b depicts the intensity profile at the boundary between two areas 41,42 in an arrangement as discussed above. As shown, as one traverses the overlapping area 43, the decreasing intensity profile 44 of the first area 41 is compensated for by the increasing intensity profile 45 of the second area 42, such that the overall intensity profile 46 of the line is constant along the length of the line. A desirable aspect of the arrangement of the intensity profiles depicted in FIGS. 7a and 7b compared to an arrangement in which the intensity of the radiation along a line within the overlap part of each area is half of the intensity in a non-overlapping part of the area is that the impact of a small error in the placement of the two areas is smaller. For example, a small displacement of one area relative to the other in a direction parallel to the lines in the step-change intensity profile arrangement, previously described, will result in a small section of the line being exposed with half the standard dose or one and a half times the standard dose. However, using the arrangement of FIGS. 7a and 7b, the effect will be a small part of the line being exposed with slightly above or slightly below the standard dose.

In order to provide a required radiation intensity profile, either along the lines exposed on the substrate or from line to line, a radiation intensity distribution controller can be provided in a pupil plane of one or both of the radiation beam conditioning units 15,16 of the exposure unit 10. This can be done to control the intensity distribution of the first and second beams of radiation 12,13. The radiation intensity distribution controllers can, for example, be formed from a mask.

The mask can be changeable in order to re-configure the apparatus to operate according to the different arrangements discussed above. It can also be formed from an array of individually controllable elements in order to provide rapid changeover between different modes of operation and/or to control the overall intensity of the beams of radiation 12,13, and therefore the intensity of the radiation in the lines exposed on the substrate.

In an alternative arrangement of the first embodiment, the first and second beams of radiation 12,13 projected onto the substrate can be continuous. In such an arrangement, each of the areas on the substrate in which lines are exposed continuously overlap. An advantage of such an arrangement can be that, provided the intensity of the beams of radiation remain constant, the dose of radiation received at each point on a line exposed on a substrate can be constant if the substrate support 11 is moved relative to the exposure unit 10 at a constant velocity.

Figure 8:
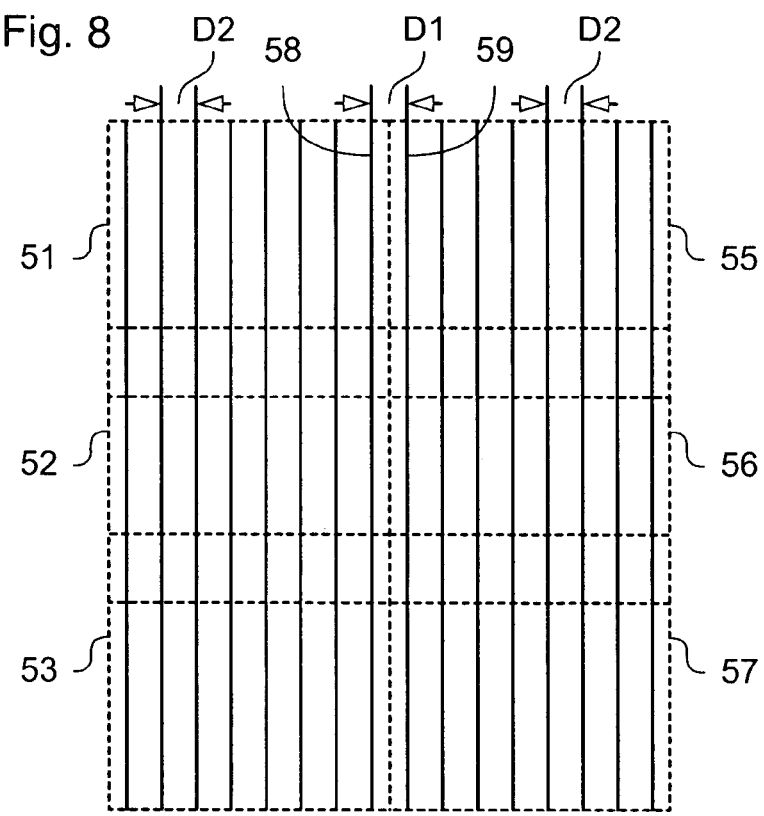
FIGS. 8 and 9 depict alternative arrangements for combining two sets of areas on a substrate exposed by an apparatus, according to one embodiment of the present invention, during different movements of a substrate support relative to an exposure unit.
Figure 9:
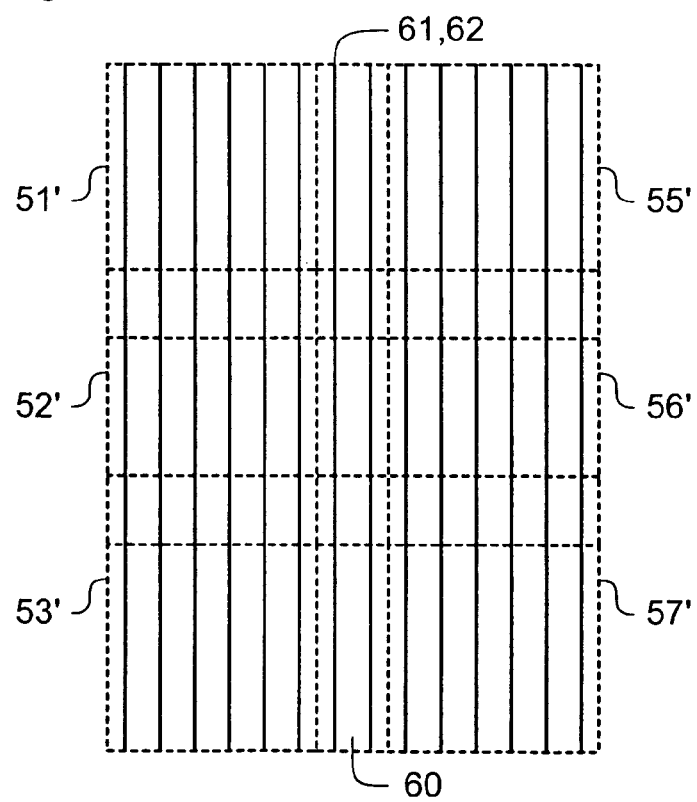

FIGS. 8 and 9 depict alternatives for combining a first plurality of areas on a substrate exposed during a first movement of the substrate table 11 relative to the exposure unit 10 with a second plurality of exposures, exposed on the substrate during a second movement of the substrate support 11 relative to the exposure unit 10.

As depicted in FIG. 8, the first plurality of areas 51,52,53 can be exposed, such that they are overlapping each other in the manner discussed above in relation to FIG. 6b. Likewise, the second plurality of areas 55,56,57 exposed on the substrate can be overlapping each other. It should be appreciated, however, that both the first plurality of areas 51,52,53 and/or the second plurality of areas 55,56,57 can be arranged immediately adjacent each other in the manner discussed above in relation to FIG. 6a.

As shown, the first plurality of areas 51,52,53 are exposed on the substrate, such that they are immediately adjacent to the second plurality of areas 55,56,57, respectively. In particular, the areas can be exposed on the substrate such that the separation D1 between the line 58 of the first plurality of areas 51,52,53 that is closest to the second plurality of areas 55,56, 57 and the line 59 of the second plurality of areas 55,56,57 that is closest to the first plurality of areas 51,52,53 is the same as the separation D2 between each of the lines within either the first or second plurality of areas. Accordingly, the separation of the lines remains constant across the first and second plurality of areas, including at a boundary between the first and second plurality of areas.

Alternatively, as depicted in FIG. 9, the first plurality of areas 51',52',53' can be exposed such that they overlap with the second plurality of areas 55',56',57'. Accordingly, in order to maintain the spacing of the lines across both the first plurality of areas and the second plurality of areas, in an overlapping part 60 of the first and second pluralities of areas, at least one line 61 of the first plurality of areas 51',52',53' overlaps with and is aligned with a corresponding line 62 of the second plurality of areas 55',56',57'.

In one example, in order to ensure that the radiation dose of the lines exposed in an overlapping part 60 of the pluralities of areas is the same as the radiation dose of a line exposed in a non-overlapping part of the pluralities of areas, the intensity of the radiation of the lines 61,62 in the overlapping part 60 of the first and second pluralities of areas can be reduced compared to the non-overlapping parts. For example, the intensity of lines in each of the first and second pluralities of areas can be half as much in the overlapping part 60 as in the non-overlapping parts.

In one example, the actuator 17 can be configured in order to move the substrate support 11 relative to the exposure unit 10 in order to expose the first and second pluralities of areas on the substrate. The configuration can be such that the actuator can continuously move the substrate support 11 relative to the exposure unit 10 in a direction parallel to the lines exposed on the substrate while a plurality of areas on the substrate are exposed. The actuator can also move the substrate support 11 relative to the exposure unit 10 in a direction perpendicular to the lines exposed on the substrate between exposing a first plurality of areas on the substrate and exposing a second plurality of areas on the substrate. Alternatively, a separate actuator can be provided in order to move the substrate support 11 relative to the exposure unit 10 in a direction perpendicular to the lines exposed on the substrate.

EMBODIMENT 2

In an alternative arrangement to that discussed above in relation to the first embodiment, in a second embodiment the substrate support 11 is moved continuously relative to the exposure unit in a direction perpendicular to the direction of the lines exposed on the substrate, while the exposure unit exposes lines on a plurality of areas on the substrate. It should be appreciated that variants discussed above in relation to the first embodiment can be applicable to the second embodiment, and discussion thereof will not be repeated.

Figure 10A:
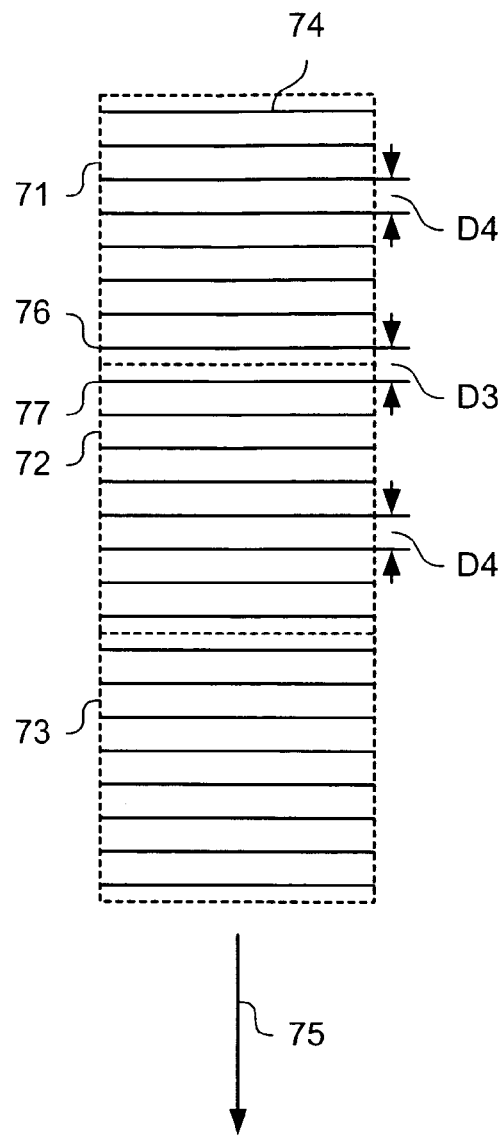
FIGS. 10a and 10b depict alternative arrangements of areas on a substrate exposed with lines in a single movement of a substrate support relative to an exposure unit, according to a second embodiment of the present invention.
Figure 10B:
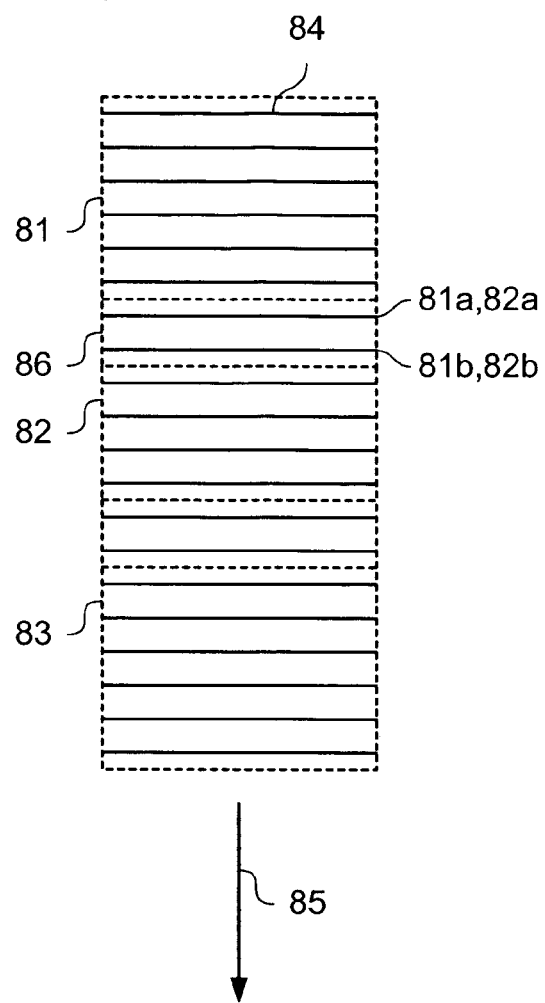

FIGS. 10a and 10b depict alternative arrangements for exposing a plurality of areas on the substrate during a single movement of the substrate support 11 relative to the exposure unit 10. As depicted in FIG. 10a, a plurality of areas 71,72,73 are successively exposed on the substrate with lines 74 by moving the substrate support 11 relative to the exposure unit 10 in a direction 75 that is perpendicular to the line 74. As shown, each of the areas 71,72,73 is immediately adjacent the previous area exposed on the substrate. Accordingly, the second area 72 is immediately adjacent the first area 71, the third area 73 is immediately adjacent the first area 71, and the third area 73 is immediately adjacent the second area 72.

In the same way as discussed above in relation to the first embodiment, the first and second beams of radiation 12,13 of the exposure unit 10 can be pulsed in synchronism with the requisite timing necessary to ensure that the lines 74 are exposed in the correct areas on the substrate. In particular, as predicted in FIG. 10a, the separation between the pulses and the speed of movement of the substrate support 11 relative to the exposure unit 10 can be selected such that the separation D3 between the line 76 of a first area 71, which is closest to a second area 72, and the line 77 of the second area 72, which is closest to the first area 71, is the same as the separation D4 between the lines 74 of either the first and/or second areas 71,72. Accordingly, the separation of the lines can be constant throughout the plurality of areas and between the areas.

FIG. 10b depicts an alternative arrangement for the second embodiment. A plurality of areas on the substrate are successively exposed by the exposure unit 10, while the substrate support 11 is continuously moved relative to the exposure unit in a direction 85 that is perpendicular to the lines 84 exposed in each of the areas 81,82,83. In this case, each of the areas 81,82,83 overlaps with the adjacent areas. Accordingly, the second area 82, for example, overlaps with both the first and third areas 81,83. The relative position of the areas 81,82,83 can be arranged such that in the part of an area that overlaps with another area, the lines of both areas are superimposed. For example, as depicted in FIG. 10b, in the part 86 of the first area 81 that overlaps with a corresponding part 86 of the second area 82, lines 81a,81b of the first area 81 overlap with the lines 82a,82b of the second area 82. Accordingly, the distribution of the lines throughout the first, second and third areas 81,82,83, including in the overlap regions, remains constant.

Figure 11A:
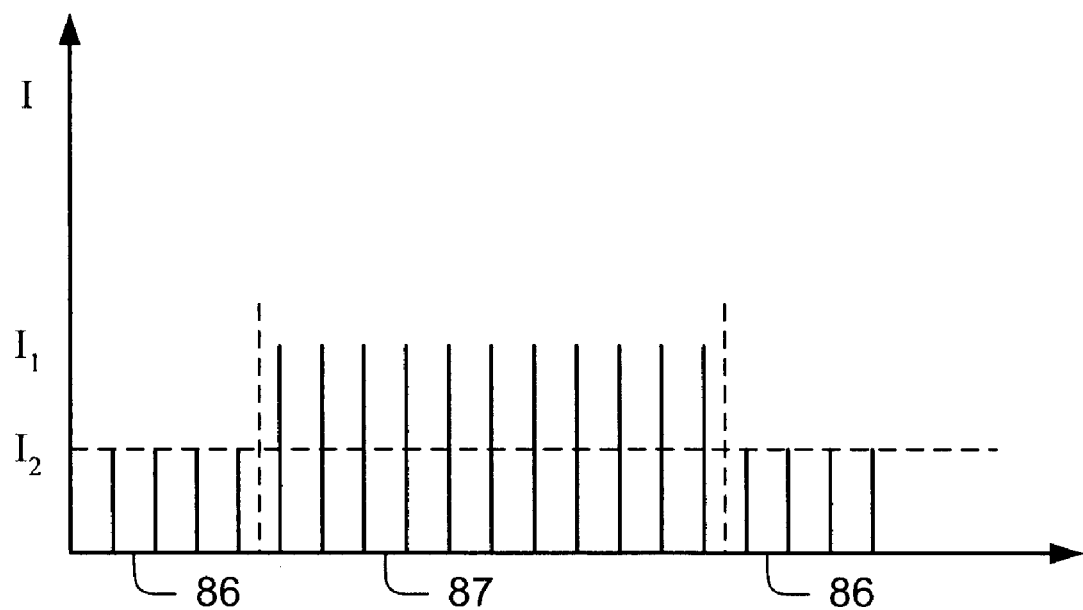
FIGS. 11a and 11b depict a distribution of an intensity of radiation exposed in each of the lines within an area exposed by a lithographic apparatus, according to two arrangements of the second embodiment of the present invention.

In one example, in order to ensure that the radiation dose of all of the lines is the same, such that the width of all of the lines is the same, the intensity of the radiation projected onto each line within each area is less in the overlapping part of the area than in the non-overlapping part of the area. For example, as depicted in FIG. 11*a*, the intensity I1 of the radiation in the lines within a part 87 of an area that does not overlap with another area can be twice that of the intensity I2 of the radiation in the areas 86 that do overlap with another area.

Figure 11B:
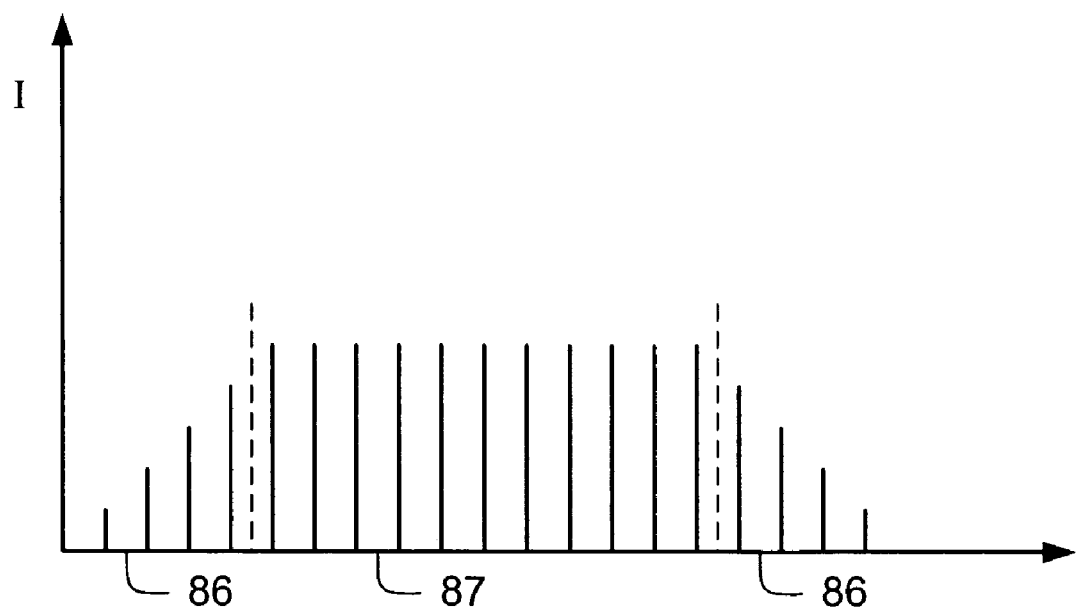

Alternatively, as depicted in FIG. 11*b*, the intensity distribution from line to line across an area can be such that the intensity of I of the radiation within the overlap areas 86 gradually decreases in a manner corresponding to that depicted in FIG. 7*a*. Then, as one traverses the boundary between two areas, the decreasing intensity of the lines of radiation in one area compensates for the increasing intensity of the radiation of the lines of the second area, such that the total dose of radiation received by each line is constant. This arrangement can be desirable because it can be difficult to provide the intensity profile depicted in FIG. 11*a*, namely sharp changes in the intensity from line to line due to, for example, diffraction effects.

It should be appreciated that the distribution of the intensity of the lines discussed above in relation to FIGS. 11*a* and 11*b* may not only be used in relation to the boundaries between successively exposed areas during a given movement of the substrate support relative to the exposure unit. For example, as depicted in FIG. 10*b*. However, the distribution of the intensity of the lines can be applied to the boundaries between first and second pluralities of areas exposed during first and second movements of the substrate support relative to the exposure unit, as discussed above in the first embodiment in relation to FIG. 9.

It should also be appreciated that, although the arrangement depicted in FIG. 10*b* has only been described in relation to two exposure areas overlapping, it can also be applied to configurations in which each line exposed on the substrate is exposed from a plurality of exposures. For example, if the substrate support 11 only advances relative to the exposure unit 10 between each pulse of the beams of radiation 12,13 by an amount equivalent to one quarter of the width of the exposure area in the direction of movement, the total radiation dose received by each line will be the sum of the radiation dose received in each of four successive exposures. The radiation intensity profile of the lines would need to be adjusted accordingly.

Figure 12:
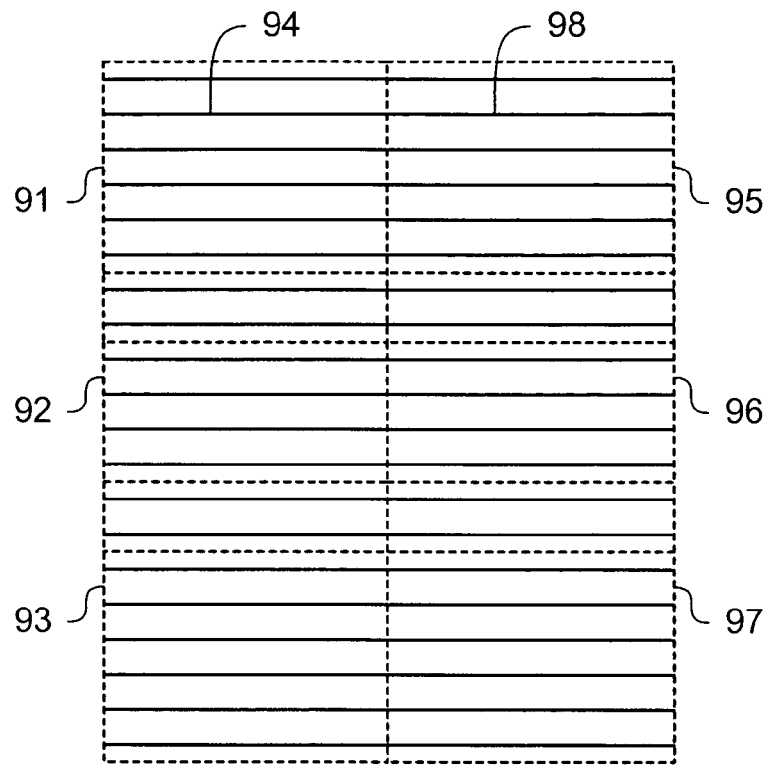
FIGS. 12 and 13 depict an arrangement by which two groups of areas on a substrate exposed by a lithographic apparatus, according to the second embodiment, during different movements of the substrate support relative to the exposure unit can be combined.
Figure 13:
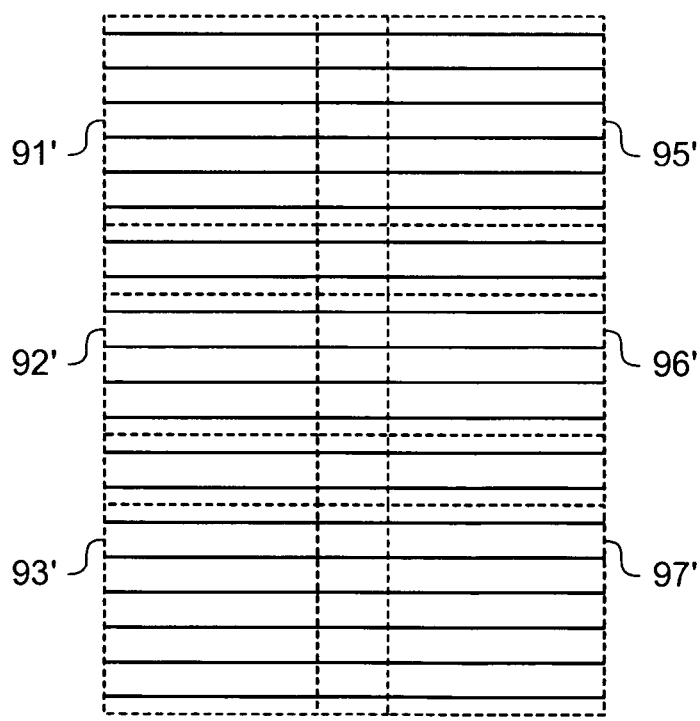

FIGS. 12 and 13 depict alternative arrangements according to the second embodiment of the present invention. These arrange can be used for combining the exposure of a first plurality of areas 91,92,93 in which lines 94 are exposed on the substrate in a first continuous movement of the substrate support 11 relative to the exposure unit 10 and a second plurality of areas 95,96,97 on the substrate in which lines 98 are exposed on the substrate during a second continuous movement of the substrate support 11 relative to the exposure unit 10. It will be appreciated that, although the first and second pluralities of areas depicted in FIGS. 12 and 13 are depicted overlapping one another in the manner discussed above in relation to FIG. 10*b*, one or both can be arranged such that the areas within each plurality of areas are arranged immediately adjacent to each other in the manner discussed above in relation to FIG. 10*a*.

As depicted in FIG. 12, the first plurality of areas 91,92,93 can be arranged immediately adjacent to the second plurality of areas 95,96,97, such that the lines 94 in the first plurality of areas 91,92,93 are aligned with the lines 98 formed in the second plurality of areas 95,96,97.

Alternatively, as depicted in FIG. 13, the first plurality of areas 91',92',93' can be arranged to overlap with the second plurality of areas 95',96',97' in the same manner as a plurality of successive areas can overlap in the first embodiment in the manner as discussed in relation to FIG. 6*b*.

It should be appreciated that the variations discussed above in relation to the overlap of successive areas exposed in the first embodiment also apply to the overlap between successive pluralities of areas that are exposed during successive movements of the substrate support 11 relative to the exposure unit 10. The details thereof will not be repeated.

Although the first and second embodiments discussed above describe a system in which the substrate is scanned relative to the exposure unit in a direction that is parallel to or perpendicular to, respectively, the lines exposed by the exposure unit during a sequence of exposures, it should be appreciated that the invention can be implemented by a system in which the substrate is scanned in a direction at any angle relative to the lines exposed on the substrate. In particular, it will be appreciated that any arbitrary direction of movement of the substrate relative to the exposure unit can be divided into a component of the movement that is in a direction parallel to the lines exposed on the substrate and a component of the movement that is perpendicular to the direction of the lines exposed on the substrate. In such a general arrangement, the size of the component of the movement in the direction parallel to the lines can be selected in the manner discussed above in relation to the first embodiment in order to provide the required radiation dose for each of the lines. Similarly, the size of the component of the movement in the direction perpendicular to the lines exposed on the substrate can be selected in a manner corresponding to that discussed above in relation to the second embodiment such that lines exposed in one exposure are aligned with and exposed on top of lines exposed in another exposure and/or in order to ensure that the separation between lines in subsequent exposures is consistent with the separation of the lines within each exposure.

Figure 14:
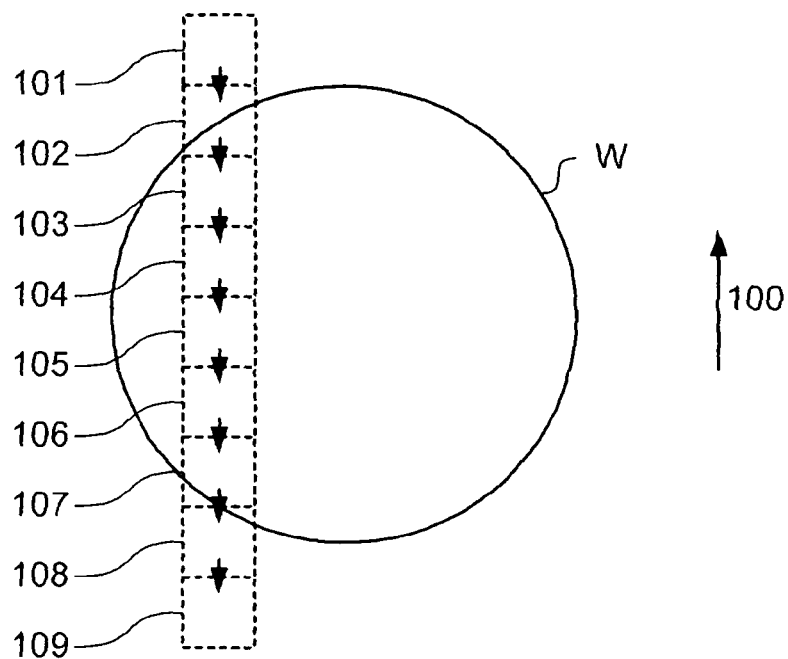
FIGS. 14, 15a and 15b depict sequences of exposures that can be used in a lithographic apparatus, according to one embodiment of the present invention.

FIG. 14 depicts a possible sequence of exposures of a plurality of areas on a substrate W that can be used with either the first or second embodiment. As shown, as the substrate W is moved relative to the exposure unit 10 in a given direction 100, a plurality of areas on the substrate are exposed such that a strip of the substrate W is exposed with lines by the exposure unit 10. As depicted, the exposure unit 10 can be configured such that the exposures begin with an area 101 in which no part of the substrate W itself is exposed. Subsequently, an area 102 is exposed with lines in which only part of the area corresponds to the substrate W. Subsequently, areas 103,104, 105,106 are exposed on the substrate W, followed by areas 107,108 that are partial exposures of the substrate W. Finally, an exposure can be performed that is entirely clear of the substrate W. Accordingly, the exposure sequence can commence before the exposure area of the exposure unit 10 intercepts the substrate W and continues until an entire strip of the substrate W has been exposed and the exposure area of the exposure unit 10 is, again, clear of the substrate W. This avoids difficulties in starting and finishing sequences of exposures while projecting radiation onto the substrate.

It will be appreciated that the exposure of areas 101,109 can be omitted or can be used in conjunction with sensors mounted on the substrate support 11 for calibration measurements of the exposures by the exposure unit 10. It should also be appreciated that, although FIG. 14 is depicted for an arrangement in which adjacent areas that are exposed do not overlap, this is for clarity only and the arrangement can also be used for arrangements in which adjacent areas overlap.

Figure 15A:
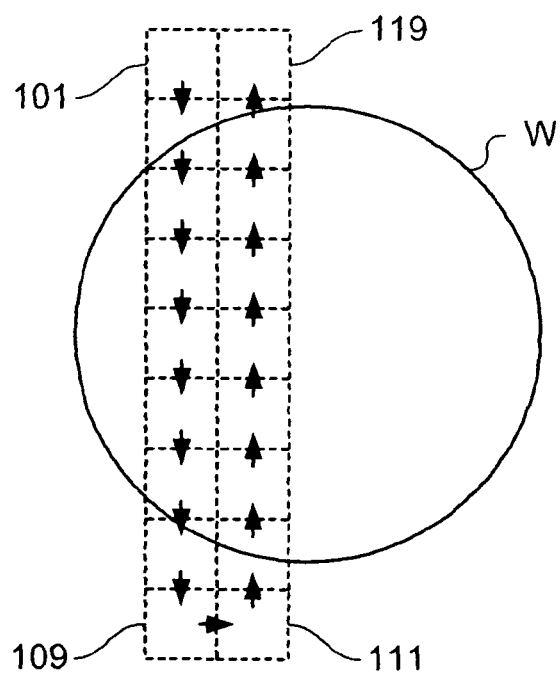
Figure 15B:
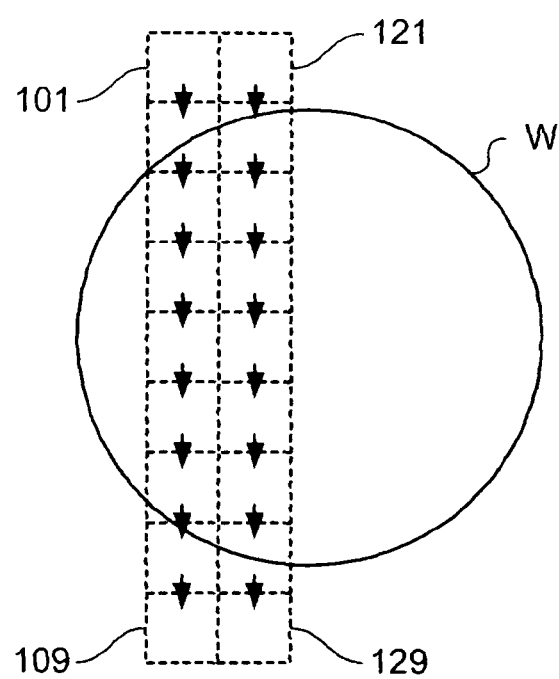

FIGS. 15a and 15b depict alternative arrangements for exposing a second plurality of areas adjacent to the first plurality of areas 101 to 109. As depicted in FIG. 15a, once the first plurality of areas 101 to 109 have been exposed, the substrate W can be moved in a direction perpendicular to the direction 100 in which the substrate was moved during the exposure of the first plurality of areas 101 to 109. Subsequently, the substrate W can be moved parallel to the direction 100 in which it is moved for the exposure of the first plurality of areas 101 to 109, but in the opposite sense in order to expose the second plurality of areas 111 to 119. Other than the direction of movement, the exposure of the second plurality of areas 111 to 119 can be the same as the exposure of the first plurality of areas 101 to 109.

FIG. 15b depicts an alternative arrangement of the exposure of the second plurality of areas. In this case, after completion of the exposure of the final area 109 of the first plurality of areas 101 to 109, the substrate W is moved such that the first area 121 of the second plurality of areas 121 to 129 can be exposed immediately adjacent to the first area 101 of the first plurality of exposures 101 to 109 in a direction perpendicular to the direction 100 in which it was moved for the first plurality of exposures. Thereafter, the substrate W can be moved in the same direction 100 as it was for the exposure of the first plurality of areas 101 to 109 during which the second plurality of areas 121 to 129 can be exposed in the same manner as the first plurality of areas 101 to 109. As before, it should be appreciated that although FIGS. 15a and 15b depict arrangements in which the first and second pluralities of areas are exposed immediately adjacent to each other, this arrangement can also be used to expose first and second pluralities of areas that overlap each other.

It should be appreciated that by using the exposure sequences discussed above in relation to FIGS. 14, 15a and 15b, the entire substrate W can be exposed with a plurality of lines. In practice, a plurality of devices can be formed on each substrate. It is typically necessary to expose patterns on the substrate in such a way that there is a gap between the patterns corresponding to each of the devices formed on the substrate W. Such a gap is required for alignment marks and to ensure that once the formation of the devices is completed, the devices can be separated, for example by dicing the substrate. Accordingly, it can be desirable that no lines be formed in the space between the devices. Therefore, the arrangement of sequences of exposures discussed above in relation to FIGS. 14, 15a and 15b can be used to expose areas of the substrate corresponding to each device instead of the complete substrate. However, it can be faster instead to expose the entire substrate with lines in the manner discussed above and subsequently, in the trimming exposure, to expose all of the areas between the devices to be formed. Accordingly, the pattern of lines in those areas will be removed.

As will be understood from the preceding description, in order to expose the plurality of lines over the substrate, or the required portions of the substrate, using the exposure unit such as depicted in FIGS. 5a and 5b, a plurality of adjacent or overlapping exposures can be exposed in a plurality of adjacent or overlapping rows. The use of an overlap, both within rows and between rows, can be used in order to stitch together adjacent exposures, for example in order to ensure that there is no discontinuity in the lines or variations in the spacing of the lines between exposures. However, the use of overlaps within and between rows can also be used in order to compensate for intensity non-uniformities in the exposure field of the exposure unit.

Figure 16:
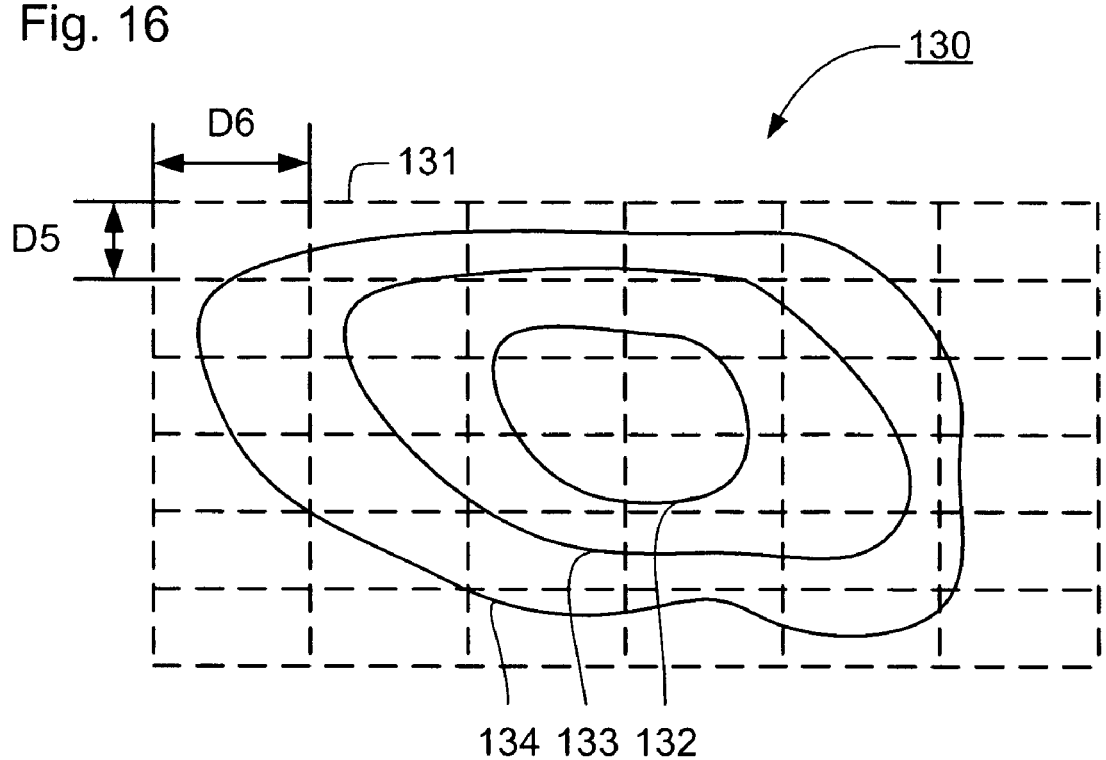
FIG. 16 depicts a radiation dose distribution within an exposure field that can be generated by an exposure unit, according to one embodiment of the present invention.

For example, FIG. 16 depicts an exposure field 130 for the exposure unit. The broken lines shown depict the exposure field, divided into a plurality of subsections 131. Within the exposure field contours 132,133,134 of the peak radiation intensity of the lines at each area within the exposure field are shown. Contour 132, for example, represents the region in which the peak intensity of the radiation within the lines is 90% of the maximum intensity, contour 133 represents 50% of the maximum intensity for the peak intensity of the lines, and contour 134 represents 10% of the maximum for the peak intensity of the lines. As shown, the intensity distribution across the field can, in practice, be significantly non-uniform.

In one example, the effect of the non-uniformity can be reduced by performing the plurality of exposures such that there is a large overlap within rows of exposures and from row to row. For example, two subsequent exposures within a row can be exposed such that the offset of the exposure field of the first exposure relative to the second exposure is the height D5 of one of the subsections 131 of the exposure field. Likewise, the overlap of successive rows of exposures can be such that the offset of one row of exposures relative to the next row of exposures is the width D6 of one of the subsections 131 of the exposure field. Consequently, once the exposure of the substrate is complete, each part of the substrate that is the same size as a subsection 131 of the exposure field will have received an exposure from each of the subsections 131 of the exposure field. Consequently, the total exposure dose received by each such portion of the substrate will be the same. Consequently, the dose uniformity across the substrate will be improved.

It will be appreciated that the size of the subsections 131 can be selected to provide sufficient dose uniformity to provide the required uniformity in the width of the lines produced with the minimal amount of overlap, corresponding to the minimal amount of time required to complete all the exposures on the substrate. It should further be appreciated that the use of overlapping exposures in order to improve the dose uniformity as described above, is applicable to both the first and second embodiments described above.

Although specific reference can have been made above to the use of embodiments of the present invention in the context of optical lithography, it will be appreciated that the present invention can be used in other applications, for example imprint lithography, where the context allows, and is not limited to optical lithography. In imprint lithography a topography in a patterning device defines the pattern created on a substrate W. The topography of the patterning device can be pressed into a layer of resist supplied to the substrate W whereupon the resist is cured by applying electromagnetic radiation, heat, pressure or a combination thereof. The patterning device is moved out of the resist leaving a pattern in it after the resist is cured.

Although specific reference can have been made above to the use of embodiments of the present invention in the context of optical lithography, it will be appreciated that the present invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the present invention have been described above, it will be appreciated that the present invention can be practiced otherwise than as described. For example, the present invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the present invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A lithographic apparatus for exposing a pattern on a substrate, comprising:
   a substrate support that is configured to support a substrate;
   an exposure unit that is configured to project two beams of pulsed radiation onto the substrate, such that each of the two beams of pulsed radiation interfere with each other to produce a series of separate exposures comprising a first exposure during a first exposure period and a second exposure during a second exposure period, the first and second exposure periods being successive, to expose a first set of parallel lines whereby a first target area of a plurality of target areas is exposed during the first exposure period and a second target area of the plurality of target areas is exposed during the second exposure period on the substrate during each pass across the substrate, each of the first and second target areas being in an area smaller than a width of the substrate; and
   an actuator that is configured to continuously move the substrate support relative to the exposure unit during exposure of the parallel lines on the first and second target areas of the substrate,
   wherein during a third exposure period to expose a second set of parallel lines, only, one of the second set of parallel lines overlaps and aligns with only one of the parallel lines of the first set of parallel lines.

2. The lithographic apparatus of claim 1, wherein the actuator is configured to move the substrate support relative to the exposure unit in a direction parallel to the parallel lines exposed by the exposure unit during the exposure periods.

3. The lithographic apparatus of claim 2, wherein the two beams of pulsed radiation projected onto the substrate by the exposure unit are pulsed in synchronism with each other.

4. The lithographic apparatus of claim 3, wherein a pulse rate of the two beams of radiation projected onto the substrate and a velocity of the substrate support relative to the exposure unit are arranged such that a first respective one of the target areas on the substrate in which a first one of the parallel lines are exposed by a pulse of the two beams is immediately adjacent a second respective one of the target areas on the substrate in which a second one of the parallel lines are exposed by a next pulse of the two beams.

5. The lithographic apparatus of claim 3, wherein a timing of the first and second exposure periods of the beams of radiation projected onto the substrate and a velocity of the substrate support relative to the exposure unit are configured such that the first target area on the substrate in which a first one of the parallel lines are exposed by the two beams overlaps with the second target area on the substrate in which a second one of the parallel lines are exposed by the two beams.

6. The lithographic apparatus of claim 5, wherein the exposure unit is configured such that a distribution of radiation intensity along the parallel lines within each of the plurality of target areas on the substrate in which the parallel lines are exposed in exposure periods of the two beams is arranged, such that the radiation intensity is lower in a portion of the first target area that overlaps with the second target area exposed by the two beams than a portion of a target area that does not overlap with another one of the target areas exposed by the two beams.

7. The lithographic apparatus of claim 6, wherein the exposure unit comprises:
   first and second illumination systems configured to condition the respective two beams of pulsed radiation; and
   a radiation intensity distribution controller provided in a pupil plane of at least one of the first and second illumination systems, the radiation intensity distribution controller being configured to control the distribution of radiation intensity along the parallel lines within each of the target areas.

8. The lithographic apparatus of claim 2, wherein the actuator is configured to move the substrate support relative to the exposure unit in a direction perpendicular to the parallel lines exposed by the exposure unit after the first and second target areas on the substrate have been exposed, such that a subsequent set of the target areas are exposed by again moving the substrate support relative to the exposure unit in a direction parallel to the parallel lines.

9. The lithographic apparatus of claim 8, wherein the first and second target areas on the substrate overlap.

10. The lithographic apparatus of claim 9, wherein the first set of the target areas on the substrate are exposed when the substrate table is moving relative to the exposure unit in one of the opposite or same direction to the movement of the substrate table relative to the exposure unit when the second set of the target areas on the substrate are exposed.

11. The lithographic apparatus of claim 9, wherein the first and second sets of the target areas on the substrate are immediately adjacent each other.

12. The lithographic apparatus of claim 11, wherein the first set of the target areas on the substrate are exposed when the substrate table is moving relative to the exposure unit in one of the opposite or same direction to the movement of the substrate table relative to the exposure unit when the second set of the target areas on the substrate are exposed.

13. The lithographic apparatus of claim 1, wherein the actuator is configured to move the substrate support relative to the exposure unit in a direction perpendicular to the parallel lines exposed by the exposure unit while the exposure unit exposes the parallel lines on the target areas on the substrate.

14. The lithographic apparatus of claim 13, wherein the two beams of radiation projected onto the substrate by the exposure unit are pulsed in synchronism with each other.

15. The lithographic apparatus of claim 14, wherein a pulse rate of the two beams of radiation projected onto the substrate, a spatial distribution of the parallel lines exposed in an area on the substrate, and a velocity of the substrate support relative to the exposure unit are arranged such that the separation between the parallel lines in a first one of the target areas on the substrate in which the parallel lines are exposed by the pulse of the two beams that is closest to a second one of the target areas on the substrate in which the parallel lines are exposed by a next pulse of the two beams, and a nearest line of the parallel lines in the second area on the substrate in which the parallel lines are exposed by the next pulse of the beams is the same as a separation of adjacent ones of the parallel lines within each of the target areas.

16. The lithographic apparatus of claim 14, wherein a pulse rate of the two beams of radiation projected onto the substrate, a spatial distribution of the parallel lines exposed on the substrate, and a velocity of the substrate support relative to the exposure unit are arranged such that at least one line of the parallel lines exposed by a pulse of the two beams is exposed at a same location on the substrate as a line of the parallel lines exposed by a next pulse of the two beams.

17. The lithographic apparatus of claim 16, wherein the exposure unit is configured such that a radiation intensity of the parallel lines exposed by the pulse of the two beams at the same location on the substrate as the parallel lines exposed by another pulse of the two beams is lower than the parallel lines exposed by a single pulse of the two beams.

18. The lithographic apparatus of claim 13, wherein the actuator is configured to move the substrate support relative to the exposure unit in a direction parallel to the parallel lines exposed by the exposure unit after a first set of the target areas on the substrate have been exposed such that a second set of the target areas are subsequently be exposed by again moving the substrate support relative to the exposure unit in a direction perpendicular to the parallel lines.

19. The lithographic apparatus of claim 18, wherein the first and second sets of the target areas on the substrate overlap.

20. The lithographic apparatus of claim 19, wherein the first set of target areas on the substrate are exposed when the substrate table is moving relative to the exposure unit in an opposite or same direction to a movement of the substrate table relative to the exposure unit when the second set of target areas on the substrate are exposed.

21. The lithographic apparatus of claim 18, wherein the first and second sets of the target areas on the substrate are immediately adjacent each other.

22. The lithographic apparatus of claim 21, wherein the first set of target areas on the substrate are exposed when the substrate table is moving relative to the exposure unit in an opposite or same direction to a movement of the substrate table relative to the exposure unit when the second set of target areas on the substrate are exposed.

23. The lithographic apparatus of claim 1, wherein the lithographic apparatus is configured to:
commence projecting the two beams of pulsed radiation from the exposure unit when the substrate support is positioned by the actuator such that the parallel lines are not exposed on the substrate by the exposure unit; and
move continuously the substrate table relative to the exposure unit, at least until a predetermined amount of the plurality of targets areas on the substrate have been exposed by the exposure unit.

24. The lithographic apparatus of claim 1, wherein the lithographic apparatus is configured to continue projecting the two beams of pulsed radiation from the exposure unit and to continuously move the substrate table relative to the exposure unit, at least until a predetermined amount of the parallel lines are no longer exposed on the substrate.

25. The lithographic apparatus of claim 1, wherein the lithographic apparatus is configured such that, during the exposure of the target areas on the substrate, the exposure unit exposes the parallel lines on at least the first and second target areas of the substrate, corresponding to first and second devices to be formed adjacent to each other on the substrate, and a third target area located between the first and second regions.

26. The lithographic apparatus of claim 25, wherein the lithographic apparatus is configured such that the exposure unit exposes the parallel lines on the entire substrate.

27. The lithographic apparatus of claim 25, further comprising:
a second exposure unit configured to expose a pattern of radiation on the substrate, wherein at least a part of the pattern is used to expose substantially the entire third region.

28. The lithographic apparatus of claim 27, wherein the second exposure unit comprises an array of individually controllable elements that is used to modulate a beam of radiation that is projected onto the substrate in order to expose the pattern of radiation on the substrate.

29. The lithographic apparatus of claim 1, further comprising:
a second exposure unit comprising a patterning device that is configured to modulate a beam of radiation and a projection system that is configured to project the modulated beam of radiation onto the substrate in order to expose a pattern of radiation on the substrate.

30. The lithographic apparatus of claim 29, wherein the patterning device comprises an array of individually controllable elements that is used to modulate a beam of radiation that is projected onto the substrate in order to expose the pattern of radiation on the substrate.

31. The lithographic apparatus of claim 1, wherein each of the first and second target areas overlap by less than half.

32. A device manufacturing method, comprising:
using an exposure unit to project two beams of pulsed radiation onto a substrate, such that each of the two beams interfere with each other to produce a series of separate exposures comprising a first exposure during a first exposure period and a second exposure during a second exposure period, the first and second exposure periods being successive, to expose a first set of parallel lines whereby a first target area is exposed during the first exposure period and a second target area is exposed during the second exposure period on the substrate during each pass across the substrate, each of the first and second target areas being an area smaller than a width of the substrate supported on a substrate support; and
continuously moving the substrate support relative to the exposure unit, while the parallel lines are exposed on the first and second target areas on the substrate by the exposure unit,
wherein during a third exposure period to expose a second set of parallel lines, only one of the second set of parallel lines overlaps and aligns with only one of the parallel lines of the first set of parallel lines.

33. A flat panel display manufactured according to the method of claim 32.

34. An integrated circuit device manufactured according to the method of claim 32.

* * * * *